United States Patent [19]
Stelter

[11] Patent Number: 5,865,970
[45] Date of Patent: *Feb. 2, 1999

[54] PERMANENT MAGNET STRUCURE FOR USE IN A SPUTTERING MAGNETRON

[75] Inventor: Richard E. Stelter, Livermore, Calif.

[73] Assignee: Permag Corporation, Fremont, Calif.

[*] Notice: This patent issued on a continued prosecution application filed under 37 CFR 1.53(d), and is subject to the twenty year patent term provisions of 35 U.S.C. 154(a)(2).

[21] Appl. No.: 606,450

[22] Filed: Feb. 23, 1996

[51] Int. Cl.$^6$ .................................................... C23C 14/34
[52] U.S. Cl. ................... 204/298.19; 204/298.16; 204/298.2
[58] Field of Search .................. 204/298.16, 298.17, 204/298.19, 298.2, 298.22

[56] References Cited

U.S. PATENT DOCUMENTS

| | | | |
|---|---|---|---|
| 2,398,653 | 4/1946 | Linlor | 175/21 |
| 3,365,599 | 1/1968 | Brzezinski et al. | 210/222 |
| 3,737,822 | 6/1973 | Buus et al. | 335/304 |
| 3,768,054 | 10/1973 | Neugebauer | 335/304 |
| 4,448,653 | 5/1984 | Wegmann | 204/298.19 |
| 4,461,688 | 7/1984 | Morrison, Jr. | 204/298.19 |
| 4,482,034 | 11/1984 | Baemann | 188/165 |
| 4,631,106 | 12/1986 | Nakazato et al. | 204/298.2 |
| 4,707,663 | 11/1987 | Minkoff et al. | 324/319 |
| 4,746,417 | 5/1988 | Ferenbach et al. | 204/298 |
| 4,806,894 | 2/1989 | Koto | 335/214 |
| 4,869,811 | 9/1989 | Wolanski et al. | 209/212 |
| 4,872,964 | 10/1989 | Suzuki et al. | 204/298 |
| 4,995,958 | 2/1991 | Anderson et al. | 204/298.2 |
| 5,047,130 | 9/1991 | Akao et al. | 204/192.12 |
| 5,107,238 | 4/1992 | Leupold | 335/306 |
| 5,130,005 | 7/1992 | Hurwitt et al. | 204/192.12 |
| 5,164,063 | 11/1992 | Braeuer et al. | 204/298.2 |
| 5,171,415 | 12/1992 | Miller et al. | 204/298.09 |
| 5,194,131 | 3/1993 | Anderson | 204/192.12 |
| 5,262,028 | 11/1993 | Manley | 204/298.19 |
| 5,382,344 | 1/1995 | Hosokawa et al. | 204/298.2 |

*Primary Examiner*—Nam Nguyen
*Assistant Examiner*—Rodney G. McDonald
*Attorney, Agent, or Firm*—Blakely, Sokoloff Taylor & Zafman, LLP

[57] ABSTRACT

A dipole permanent magnet structure for use in a sputtering magnetron in which a central magnet structure having a magnetic field orientation parallel to a base plate, and upon which the central magnet is mounted, is placed adjacent to a first salient magnet having a magnetic field orientation orthogonal to the magnetic field orientation of the central magnet. A second salient magnet, located adjacent to the central magnet structure, has a magnetic field orientation orthogonal to the magnetic field orientation of the central magnet, but opposite polarity of the first salient magnet. The structure provides increased magnetic field strength and intensity along the working face of the sputtering magnetron to saturate and penetrate a target material inserted into the vacuum chamber of a sputtering system to facilitate the sputtering process.

15 Claims, 3 Drawing Sheets

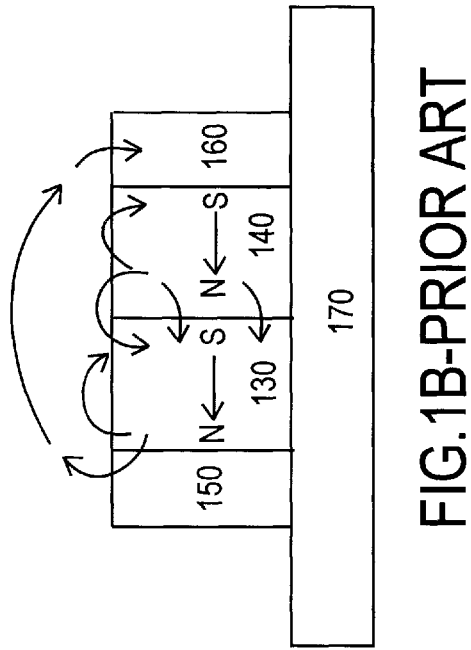
FIG.1C-PRIOR ART
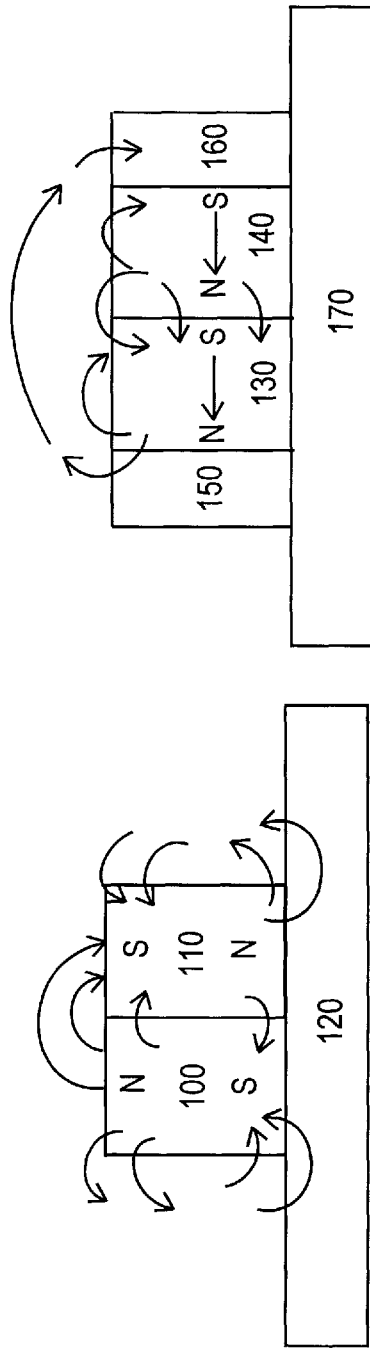
FIG.1B-PRIOR ART
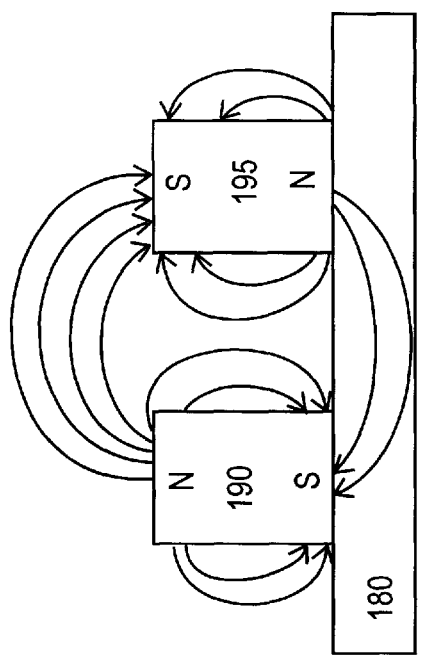
FIG.1A-PRIOR ART

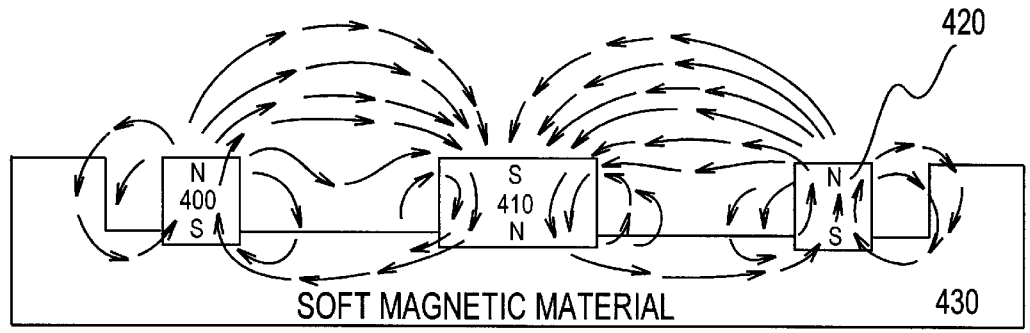
FIG. 4 - PRIOR ART
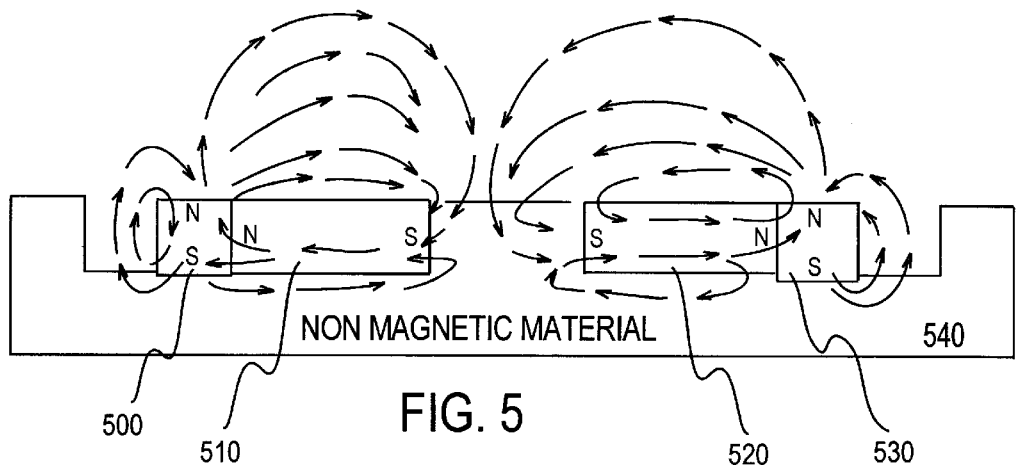
FIG. 5
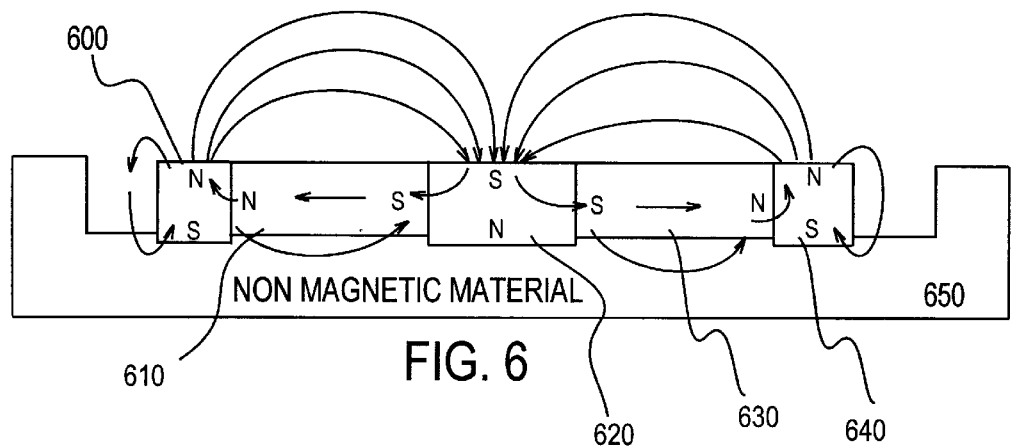
FIG. 6

PERMANENT MAGNET STRUCURE FOR USE IN A SPUTTERING MAGNETRON

BACKGROUND OF THE INVENTION

1. Field of the Invention

The present invention relates to the field of permanent magnets. More specifically, the present invention relates to the field of a permanent magnet structure as may be embodied in a sputtering magnetron for generating an external magnetic field capable of saturating and penetrating a target material used in a sputtering process.

2. Description of the Related Art

Introduction

Sputtering is a process in which atoms of a target material are deposited on a substrate. In general, the sputtering process involves loading clean substrates into a vacuum chamber, evacuating the chamber to a low pressure to remove contaminants, filling the chamber with an inert gas, (such as argon), to a particular operating pressure, initiating and sustaining a glow discharge, or plasma, by application of a high negative electrostatic voltage to a cathode/target assembly, and sputter depositing of the target material onto the substrates.

When a sufficiently large DC voltage is applied to the sputtering system, electrons are pulled from the target material towards the substrates. As the target electrons move from the target material toward the substrates, many such electrons strike argon gas atoms. This strips electrons from the argon atoms, leaving positively charged argon ions and liberating additional electrons. The positively charged argon ions accelerate toward the surface of the negative target and gain kinetic energy. Energy is transferred to the target surface upon impact and neutral atoms of the target material are ejected as a result. Target atoms expend energy as they travel from the target surface, so the substrates are generally located nearby, where bombardment energy causes the target atoms to deposit on, and diffuse into, the substrate surface. Electrons are also freed from the target surface and accelerate into the plasma where they strike argon gas atoms to create more ions and free electrons to sustain the process.

In an improvement to the sputtering system, the external magnetic field of a magnet assembly, called a magnetron, is superimposed upon the electric field to speed up the sputtering process. The external magnetic field traps electrons liberated from the target by applying a magnetomotive force to direct the electrons back to the surface of the negative target where they are repelled. The resulting path of the electrons becomes convoluted, i.e., a spiral path through the argon gas. This increases the frequency of strikes with argon atoms which creates more argon ions to strike the target surface and transfer target material from the target to the substrates at a faster rate. The arrangement of magnetic and electric fields in the sputtering system is known to those of ordinary skill in the art as a cross field device.

It should be noted that ion strikes on the target are distributed around the center line of the charged particle path. This causes a characteristic gaussian erosion pattern normal to the path of the charged particle. The center of the erosion pattern, i.e., the greatest erosion depth, occurs where the magnetic neutral zone is found. It is at this point that the magnetic field vector component parallel to the target surface is at a maximum.

If the strength of the magnetic field vector component parallel to the target surface is increased, the sputter rate increases up to an asymptotic level. Thus, there is a limit to the useful intensity of the applied magnetic field, depending on particle velocity due to electrostatic field strength, sputter system pressure, and other well known physical parameters of the sputtering system.

If the external magnetic field generated by the sputtering magnetron can be spread so the magnetic field vector component parallel to the target surface (normal to the electric field) covers a larger width, or area, then the erosion pattern on the target surface will spread providing more of the available target material for use in the sputtering system. This is relevant to the economy of the sputtering system operation. Such a result can be accomplished by spreading the effective magnetic poles and/or superimposing the magnetic fields of several dipole magnets so their external magnetic field components add, or buck, and shape the external magnetic field. However, the magnetic field vector component parallel to the target surface will generally be greatest close at the midpoint between magnetic poles, but to a lesser degree.

Where the target material in a sputtering system is magnetically permeable, magnetron influenced sputtering occurs if, and when an external magnetic field saturates and passes through the target material. The external magnetic field will pass through the target material if the target material offers a low reluctance path, and in a manner inversely proportional to the reluctance of available magnetic flux paths, or if the magnetron supplies sufficient magnetic flux to saturate the target. Generally, permanent magnets with high residual induction are utilized to provide sufficient magnetic flux.

Permeable magnetic materials have a characteristic "S" shaped permeability versus magnetization curve. Since reluctance is proportional to permeability, the lowest reluctance will occur when the magnetic material is pushed into saturation. However, there may be favorable low reluctance flux paths in that portion of the ferrous target material operating in its initial permeability range. Permeable materials also produce induction, i.e., a magnetic field of their own, when their magnetic domains are aligned by an external magnetic field, e.g., the dipole field of a magnetron.

Thus, the magnetic field of the magnetron is attracted to, shunted and shaped by the location, geometry, and magnetic properties of ferrous target materials. This causes problems when attempting to shape the vector components of the magnetic field contributing to the aforementioned cross field device.

SUMMARY OF THE DISCLOSURE

The present invention relates to an arrangement of a plurality of permanent magnets to produce a permanent magnet structure capable of generating an external magnetic field for saturating and penetrating a target material in a sputtering system.

An embodiment of the present invention provides a permanent magnet structure for use in a sputtering magnetron as may be utilized in a sputtering process wherein the permanent magnet structure includes a central magnet structure having a magnetic field orientation that is parallel to a base plate upon which the central magnet sits. A salient magnet is placed adjacent to one end of the central magnet wherein the salient magnet has a magnetic field orientation orthogonal to the central magnet's magnetic field orientation. An additional salient magnet is placed adjacent to the opposite end of the central magnet structure and has a magnetic field orientation orthogonal to the magnetic field orientation of the central magnet but opposite the magnetic field orientation of the other salient magnet's magnetic field orientation. Thus, the central magnet is situated such that its north pole abuts the north salient pole and its south pole abuts the south salient pole on the side facing the target. The north to north and south to south polarity at the salient poles create a bucking field which produces greater total salient pole flux available to the target material in the sputter system. Moreover, the presence of the central magnet between the salient magnets prevents polar flux from seeking a low reluctance path over the surface of the polar magnet to the opposite pole, or a high permeability yoke material in this area, thereby reducing leakage flux.

BRIEF DESCRIPTION OF THE DRAWINGS

The embodiments of the present invention are illustrated by way of example and not limitation in the accompanying figures, in which:

FIG. 1A is a diagram of a prior art dipole permanent magnet structure as may be embodied in a sputtering magnetron.

FIG. 1B is a diagram of a prior art dipole permanent structure as may also be embodied a sputtering magnetron.

FIG. 1C is a diagram of a prior art dipole permanent magnet structure as may be embodied in a sputtering magnetron.

FIG. 4 is a diagram of a prior art permanent magnet structure embodied by a prior art sputtering magnetron.

FIG. 5 illustrates a two dimensional view of a further embodiment of the present invention.

FIG. 6 illustrates a two dimensional view of a further embodiment of the present invention.

DETAILED DESCRIPTION OF THE EMBODIMENTS OF THE INVENTION

Figure 3:
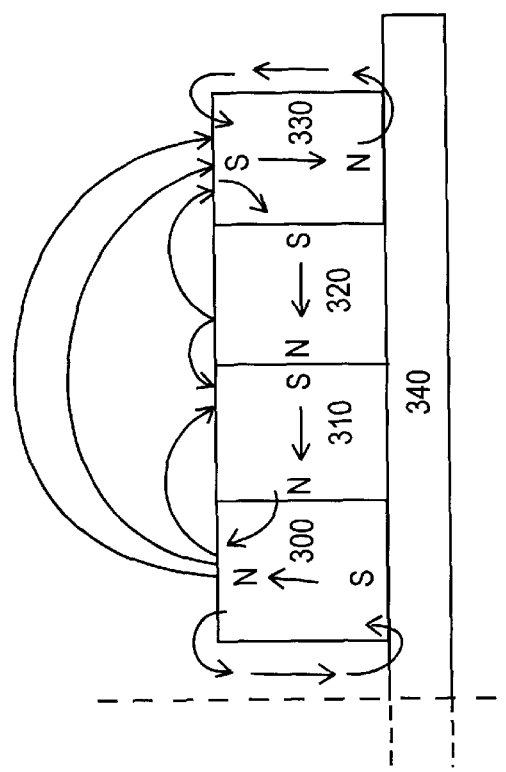
FIG. 3 is a two dimensional view of an alternative embodiment of the present invention.

The present invention relates to a configuration of a plurality of permanent magnets for producing a dipole permanent magnet structure as may be utilized in a sputtering magnetron to generate an external magnetic field for saturating and penetrating a target material in a sputtering system.

In the following description, numerous specific details are set forth in order to provide a thorough understanding of the present invention. It will be apparent, however, to one of ordinary skill in the art that the present invention may be practiced without these specific details. In other instances, well-known structures, materials, and techniques have not been shown in order not to unnecessarily obscure the present invention.

With reference to FIG. 1A, a prior art dipole permanent magnet structure as may be embodied in a sputtering magnetron is illustrated. Permanent magnets 100 and 100 both have magnetic field orientations perpendicular to a base plate, or yoke 120. An external magnetic field is generated above permanent magnets 100 and 110. Such a structure may be placed in close proximity to a target material in a sputtering system to facilitate the sputtering process. However, the total flux available to the target material is limited due to the effects of leakage flux and fringing flux. The prior art sputtering magnetron illustrated in FIG. 1B attempts to improve upon the efficiency of the magnetic circuit shown in FIG. 1A by placing adjacent to permanent magnet structures 130 and 140, permeable materials 150 and 160 to focus, or concentrate, the total flux available to the target material in the sputtering system. However, this configuration is still limited by the effects of leakage flux and fringing flux.

With reference to FIG. 1C, a further prior art dipole permanent magnet structure as may be embodied in a sputtering magnetron is illustrated. Permanent magnets 190 and 195 both have magnetic field orientations perpendicular to base plate 180. An external magnetic field is generated above permanent magnets 190 and 195. Just as in the prior art structure of FIG. 1A, the magnetron of FIG. 1C may be placed in close proximity to a target material in a sputtering system to facilitate the sputtering process. However, the lack of a central magnet having a magnetic field orientation normal to the magnetic field orientation of magnets 190 and 195, allows polar flux to seek a low reluctance path over the surface of the magnets 190 and 195 to the opposite pole, or to the high permeability base material 180. This leakage of flux diminishes the total flux available to the target material.

In order to spread the external magnetic field of the sputtering magnetron over a larger area of the target, an embodiment of the present invention may be utilized in which magnets are placed between salient poles of a magnetron dipole. As will be described below, a single magnet may be placed between the salient poles of the dipole such that its magnetic field orientation is normal to the magnetic field orientation of the primary poles of the dipole, with polarity such that like poles abut on the target side. In an alternative embodiment, as will be described below, a series of magnets may be arranged so there is a continuous rotation of the magnetic field vector between the primary poles of the magnetron dipole. Both embodiments provide an increasing vector amplitude by virtue of superpositioning of the magnetic field vector components, as well as flux projection and shaping. It is further noted both embodiments may be employed in a magnetron sputtering system, including one employing a stationary, oscillating, or rotating magnetron with concentric poles and the many derivatives thereof, including offset, apple, pear, bean, heart, etc., pole geometries.

Figure 2:
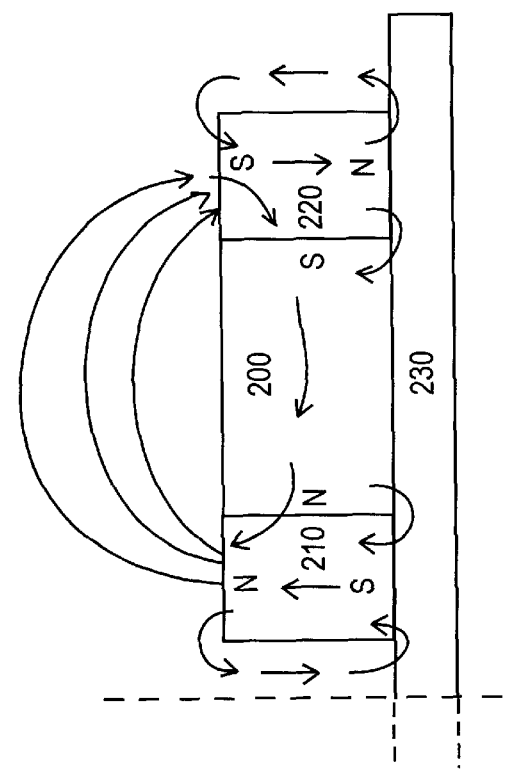
FIG. 2 is a two dimensional view of an embodiment of the present invention.

With reference to FIG. 2, an embodiment of the present invention is illustrated. A salient magnet 210 is fixed to a base plate, or yoke 230, as is a further salient magnet 220. The magnetic field orientation of salient magnets 210 and 220 is normal to the base plate. Moreover, the polarities of their magnetic fields are in opposite directions such that the coupling of salient magnets 210 and 220 to adjacent but opposite ends of a central magnet structure 200 form a continuous magnetic circuit. All magnets are comprised of magnetic material having a high residual inductance (e.g., Samarium Cobalt, or Neodymium Iron Boron (NdFeB). The combination of salient magnets 210 and 220 with the central magnet structure 200 provides for a greater amount of available magnetic flux to a target material placed in close proximity and substantially parallel to the plane created by the combination of magnets 200, 210, and 220. The addition of central magnet 200 adds to the total amount of magnetic flux generated by the sputtering magnetron. Moreover, the magnetic field orientation of the central magnet 200 orthogonal to the magnetic field orientation of salient magnets 210 and 220 creates a bucking field, thereby reducing leakage flux and fringing flux as may be experienced by the prior art sputtering magnetron configuration illustrated in FIG. 1A and FIG. 1B.

The configuration of magnets in FIG. 2 defines a working face substantially parallel to the magnetic field orientation of the central magnet structure. The magnet structure maximizes the amount of magnetic flux parallel to the working face of the three magnets. The sputtering magnetron can be mounted to a non-magnetic base 230. However, it is advantageous when the central magnet structure has a length greater than the width of the salient magnets, to provide a ferromagnetic base to shunt some of the magnetic flux and aid in the shaping of the external magnetic field generated by the magnetic circuit formed by magnets 200, 210, and 220.

FIG. 3 illustrates an alternative embodiment of the present invention in which salient magnets 300 and 330 function in a manner similar to salient magnets 210 and 220 of FIG. 2. Central magnet structure 200 of FIG. 2, however, is replaced by a series of two or more permanent magnets, each of which has a magnetic field orientation and polarity which forms a continuous magnetic circuit from salient magnet 330 to salient magnet 300. Salient magnets 300 and 330, as well as central magnets 310 and 320 are mounted upon base plate 340. Both the embodiments in FIG. 2 and FIG. 3 cause the external magnetic field parallel to the working face of the sputtering magnetron to be spread so that it covers a larger width, or area, which when placed in close proximity to a target material, causes the erosion pattern on the inner surface of the target to spread over more of the available target material. This is valuable to the efficiency of sputtering system operation since the target material must be replaced when any point on the target erodes through to the cathode assembly in the sputtering system. As was noted above, spreading the magnetic poles of the sputtering magnetron, i.e., spreading salient magnets 300 and 330, will widen the target erosion zone, but this also decreases the strength of the magnetic field vector component parallel to the target surface. By including in the sputtering magnetron central magnet structure 200, or the series of magnets 310 and 320 illustrated in FIG. 3, magnetic field strength can be recovered and the magnetic field vector component parallel to the working face of the sputtering magnetron increased.

With reference to FIG. 4, a two dimensional view of a prior art sputtering magnetron is illustrated. Salient magnets 400, 410 and 420 are mounted on a soft magnetic yoke 430 to provide a magnet arrangement for increasing magnetic field intensity and controlling field shape. However, as was the case with FIGS. 1A and 1B, the embodiment illustrated in FIG. 4 is susceptible to both fringing flux and leakage flux which diminishes the total flux available to the target material located in the external magnetic field above the working face of the sputtering magnetron. The sputtering magnetron illustrated in FIG. 5, however, is an alternative embodiment of the present invention in which magnets 510 and 520 create a bucking field for directing and shaping the external magnetic field and reducing the effects of fringing flux and leakage flux, thereby increasing the total flux available to the target material in the sputtering system. Both magnets 510 and 520 have a magnetic field orientation orthogonal to the magnetic field orientation of the magnets to which they are respectively adjacent, namely, salient magnets 500 and 530.

With reference to FIG. 6, by adding a central magnet 620 with the polarity shown to the embodiment illustrated in FIG. 5, the external magnetic field strength and intensity generated by the sputtering magnetron increases.

There are, of course, many possible alternatives to the described embodiments which are within the understanding of one of ordinary skill in the relevant art. The present invention is intended to be limited, therefore, only by the claims presented below.

Thus, what has been described is a dipole permanent magnet structure for generating an external magnetic field as may be embodied in a sputtering magnetron for use in a sputtering system.

I claim:

1. A permanent magnet structure in a sputtering magnetron utilized in a sputter depositing of a target material onto a substrate in a sputtering system, comprising
    a base plate;
    a central magnet structure having a magnetic field orientation substantially parallel to said base plate and said target material, said central magnet structure comprising a plurality of adjoining dipole permanent magnets;
    a first salient magnet adjoining said central magnet structure, said first salient magnet having a magnetic field orientation substantially orthogonal to said magnetic field orientation of said central magnet structure; and
    a second salient magnet adjoining said central magnet structure, said second salient magnet having a magnetic field orientation substantially orthogonal to said magnetic field orientation of said central magnet structure and a polarity substantially opposite that of said first salient magnet, said central magnet structure providing a continuous magnetic circuit between said first salient magnet and said second salient magnet to create an external magnetic field for saturating and penetrating said target material, and said central magnet structure having a width greater than said first or second salient magnets to spread the external magnetic field over said target material.

2. The permanent magnet structure of claim 1 wherein said base plate comprises ferromagnetic material.

3. The permanent magnet structure of claim 1 wherein said permanent magnet structure may be rotated about an axis substantially normal to said base plate.

4. The permanent magnet structure of claim 1 wherein said sputtering magnetron oscillates about an axis substantially perpendicular to said base plate.

5. The permanent magnet structure of claim 1 wherein said sputtering magnetron stationary.

6. The permanent magnet structure of claim 1 wherein the central magnet structure, first salient magnet and second salient magnet are each comprised of Samarium Cobalt.

7. In a sputtering system having a vacuum chamber, a target encompassed by said vacuum chamber, and a dipole magnetron substantially parallel to said target, said dipole magnetron having a north salient pole adjacent to and providing an external magnetic field substantially normal to said target and a south salient pole adjacent to and providing an external magnetic field substantially normal to said target to facilitate sputtering, an improvement of said dipole magnetron, comprising:
    a permanent magnet structure coupled between said north salient pole and said south salient pole of said dipole magnetron, said permanent magnet structure comprising a plurality of adjoining dipole permanent magnets providing a continuous magnetic circuit between said south salient pole and said north salient pole, said permanent magnet structure having a magnetic field orientation substantially normal to the magnetic field orientation of said north salient pole and said south salient pole such that a south pole of said permanent magnet structure and said south salient pole abut, and a north pole of said permanent magnet structure and said north salient pole abut, said permanent magnet structure having a width greater than said north salient poles to spread said external magnetic field provided to said target by said north and south salient poles.

8. The sputtering system of claim 7 wherein said dipole magnetron generates an external magnetic field for saturating and penetrating said target.

9. The sputtering system of claim 7 wherein said dipole magnetron further comprises a base plate.

10. The sputtering system of claim 7 wherein said dipole magnetron rotates about an axis substantially perpendicular to said target.

11. The sputtering system of claim 7 wherein said permanent magnet structure is comprised of Samarium Cobalt.

12. A permanent magnet structure in a sputtering magnetron utilized in a sputtering system, produced according to a method, comprising the steps of:

a) situating a base plate substantially parallel to and in proximity of a target material in the sputtering system;

b) placing on the base plate a central magnet structure having a magnetic field orientation substantially parallel to the target material, said central magnet structure comprising a plurality of adjoining dipole permanent magnets having a collective width;

c) adjoining a first salient magnet having a width less than said collective width to a first end of the central magnet structure such that the first salient magnet has a magnetic field orientation substantially orthogonal to the magnetic field orientation of the central magnet structure; and d) adjoining a second salient magnet having a width less than said collective width to a second end of the central magnet structure such that the second salient magnet has a magnetic field orientation substantially orthogonal to the magnetic field orientation of the central magnet and opposite the magnetic field orientation of the first salient magnet, thereby providing a continuous magnetic circuit between said first salient magnet and said second salient magnet to produce an external magnetic field for saturating and penetrating the target material.

13. In a sputtering magnetron utilized by a sputtering system, a method of generating an external magnetic field for saturating and penetrating a target material in the sputtering system, comprising the steps of:

a) situating a base plate substantially parallel to and in proximity of the target material;

b) placing on the base plate a central magnet structure having a magnetic field orientation substantially parallel to the target material, said central magnet structure comprising a plurality of adjoining dipole permanent magnets having a collective width;

c) adjoining a first salient magnet having a width less than said collective width to a first end of the central magnet such that the first salient magnet has a magnetic field orientation substantially orthogonal to the magnetic field orientation of the central magnet structure; and d) adjoining a second salient magnet having a width less than said collective width to a second end of the central magnet structure such that the second salient magnet has a magnetic field orientation substantially orthogonal to the magnetic field orientation of the central magnet and opposite the magnetic field orientation of the first salient magnet, thereby creating a continuous magnetic circuit between said first salient magnet and said second salient magnet.

14. The permanent magnet structure of claim 1 wherein the central magnet structure, first salient magnet and second salient magnet are each comprised of Neodymium Iron Boron.

15. The sputtering system of claim 7 wherein the permanent magnet structure is comprised of Neodymium Iron Boron.

* * * * *

UNITED STATES PATENT AND TRADEMARK OFFICE
CERTIFICATE OF CORRECTION

PATENT NO. : 5,865,970
DATED : February 2, 1999
INVENTOR(S) : Stelter

It is certified that error appears in the above-identified patent and that said Letters Patent is hereby corrected as shown below:

On title page,

Item [54] and col. 1, line 1, delete STRUCURE" and insert --STRUCTURE--.

Signed and Sealed this

Tenth Day of August, 1999

Attest:

Q. TODD DICKINSON

*Attesting Officer*    Acting Commissioner of Patents and Trademarks